United States Patent
Haneder et al.

(10) Patent No.: US 6,670,661 B2
(45) Date of Patent: *Dec. 30, 2003

(54) FERROELECTRIC MEMORY CELL WITH DIODE STRUCTURE TO PROTECT THE FERROELECTRIC DURING READ OPERATIONS

(75) Inventors: Thomas Peter Haneder, Dachau (DE); Harald Bachhofer, München (DE)

(73) Assignee: Infineon Technologies AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/046,123

(22) Filed: Jan. 7, 2002

(65) Prior Publication Data

US 2002/0105016 A1 Aug. 8, 2002

Related U.S. Application Data

(63) Continuation of application No. PCT/DE00/02190, filed on Jul. 5, 2000.

(30) Foreign Application Priority Data

Jul. 6, 1999 (DE) .......................................... 199 31 124

(51) Int. Cl.[7] .............................................. H01L 29/68
(52) U.S. Cl. ........................ 257/295; 257/296; 257/300; 257/310
(58) Field of Search ................................. 257/295, 296, 257/300, 310, 342, 410, 411, 756; 438/3

(56) References Cited

U.S. PATENT DOCUMENTS

| 5,361,225 A | 11/1994 | Ozawa |
| 5,449,935 A | * 9/1995 | Nakamura ................... 257/295 |
| 5,471,417 A | 11/1995 | Krautschneider et al. |

FOREIGN PATENT DOCUMENTS

| DE | 198 40 824 C1 | 10/1999 |
| EP | 0 566 585 B1 | 10/1993 |
| JP | 07 106 450 | 4/1995 |

OTHER PUBLICATIONS

Nakamura, T. et al.: "a Single–Transistor Ferroelectric Memory Cell", IEEE, 1995.

* cited by examiner

Primary Examiner—Minh Loan Tran
Assistant Examiner—Thomas L Dickey
(74) Attorney, Agent, or Firm—Laurence A. Greenberg; Werner H. Stemer; Gregory L. Mayback

(57) ABSTRACT

A memory cell configuration includes, as a memory cell, a ferroelectric transistor having a first gate intermediate layer and a first gate electrode between source/drain regions at the surface of a semiconductor substrate. The first gate intermediate layer contains at least one ferroelectric layer. Beside the first gate intermediate layer, a second gate intermediate layer and a second gate electrode are disposed between the source/drain regions, the second gate intermediate layer containing a dielectric layer. The first gate electrode and the second gate electrode are connected to one another through a diode structure. Strip-type doped well regions are provided in the semiconductor substrate, which well regions run between the source/drain regions of the respective ferroelectric transistor.

15 Claims, 2 Drawing Sheets

FERROELECTRIC MEMORY CELL WITH DIODE STRUCTURE TO PROTECT THE FERROELECTRIC DURING READ OPERATIONS

CROSS-REFERENCE TO RELATED APPLICATION

This application is a continuation of copending International Application PCT/DE00/02190, filed Jul. 5, 2000, which designated the United States.

BACKGROUND OF THE INVENTION

FIELD OF THE INVENTION

The invention relates to a memory cell configuration for the nonvolatile storage of data. For the nonvolatile storage of data, memory cell configurations have been proposed in which each memory cell has at least one ferroelectric transistor (see European Patent EP 0 566 585 B1, corresponding to U.S. Pat. No. 5,471,417 to Krautschneider). The term ferroelectric transistor in such a case refers to a transistor having two source/drain regions, a channel region, and a gate electrode. A ferroelectric layer, that is to say, a layer made of ferroelectric material, is provided between the gate electrode and the channel region. The conductivity of the transistor is dependent on the polarization state of the layer made of ferroelectric material. Such ferroelectric transistors are being investigated with regard to nonvolatile memories. In such a case, two different logic values of a digital information item are assigned two different polarization states of the layer made of ferroelectric material.

In the memory cell configuration disclosed in European Patent EP 0 566 585 B1, it is proposed to apply a voltage individually for the different memory cells below the ferroelectric layer at the substrate, in order, when writing information to one memory cell, to avoid altering the information in other, non-selected memory cells. To that end, there is provided below the active transistor region a doped layer, which is insulated from the general substrate by pn junctions and is insulated from adjacent memory cells by insulation regions, which represents an individual substrate for the individual ferroelectric transistor.

Another memory cell configuration with ferroelectric transistors as memory cells has been proposed in T. Nakamura, Y. Nakao, A. Kamisawa, H. Takasu: A Single Transistor Ferroelectric Memory Cell, IEEE, 1995, pages 68 to 69. Set forth in the document is that each of the ferroelectric transistors is connected between a supply voltage line and a bit line. Selection is effected through a back gate. In such a case, the ferroelectric transistors used have a floating gate electrode between the ferroelectric layer and the gate oxide, the charge of which electrode is controlled by the polarization state of the ferroelectric layer.

It has been shown that in such memory cell configurations, when the information is read, a voltage is also dropped across non-selected memory cells, which voltage can lead to corruption of the information stored in the individual memory cells. Such corruption is attributed to the fact that umklapp or fold-over processes of the domains in ferroelectric materials are of a statistical nature and can be brought about even at low voltages.

SUMMARY OF THE INVENTION

It is accordingly an object of the invention to provide a memory cell configuration that overcomes the hereinafore-mentioned disadvantages of the heretofore-known devices of this general type and that has memory cells each with a ferroelectric transistor in which alteration of the written-in information during the reading operation is avoided.

With the foregoing and other objects in view, there is provided, in accordance with the invention, a memory cell configuration, including a semiconductor substrate having a surface, strip-type doped well regions, and integrated memory cells, each of the memory cells having a ferroelectric transistor, a diode structure, and word lines running substantially parallel to one another. The ferroelectric transistor has a first source/drain region, a second source/drain region, a first gate intermediate layer and a first gate electrode disposed at the surface of the substrate between the first and second source/drain regions, the first gate intermediate layer containing at least one ferroelectric layer, a second gate intermediate layer and a second gate electrode disposed between the first and second source/drain regions in a direction of a connecting line between the first and second source/drain regions, the second gate intermediate layer containing a dielectric layer, and, beside the first gate intermediate layer, the second gate intermediate layer, the first gate electrode, and the second gate electrode connected to one another through the diode structure. The second gate electrode is respectively connected to one of the word lines and the strip-type doped well regions cross the word lines and respectively run in a region between the first and second source/drain regions of the ferroelectric transistor.

With the objects of the invention in view, there is also provided a memory cell configuration where the ferroelectric transistor has a second gate intermediate layer and a second gate electrode disposed between the first and second source/drain regions.

With the objects of the invention in view, there is also provided a memory cell configuration where the ferroelectric transistor has a second gate intermediate layer and a second gate electrode disposed between the first and second source/drain regions substantially along a line connecting the first and second source/drain regions.

In the memory cell configuration, a multiplicity of memory cells, each having a ferroelectric transistor, are provided in an integrated manner in a semiconductor substrate. The respective ferroelectric transistor includes two source/drain regions. Between the source/drain regions a first gate intermediate layer and a first gate electrode are disposed at the surface of the semiconductor substrate, the first gate intermediate layer containing at least one ferroelectric layer, and between which a second gate intermediate layer and a second gate electrode are disposed in the direction of a connecting line between the source/drain regions. Beside the first gate intermediate layer, the second gate intermediate layer containing a dielectric layer, the first gate electrode, and the second gate electrode are connected to one another through a diode structure. Furthermore, word lines that substantially run parallel are provided in the memory cell configuration, the second gate electrode in each case being connected to one of the word lines. Furthermore, strip-type doped well regions are provided in the semiconductor substrate, which well regions cross the word lines and in each case run in the region between the source/drain regions of the ferroelectric transistors.

In the memory cell configuration, one of the memory cells is selected by the associated word line and the associated strip-type doped well region. The non-selected strip-type doped well regions and word lines have applied to them voltage levels such that the polarization state of the ferroelectric layer in the non-selected memory cells is not altered. The provision of the strip-type doped well regions allows the application of an individual substrate voltage to the ferroelectric transistors disposed along the respective strip-type doped well region.

Because, in the ferroelectric transistor, the first gate electrode and the second gate electrode are disposed respectively beside one another along the connecting line between the source/drain regions, the channel region of the ferroelectric transistor is subdivided. One part of the channel region, which is disposed beneath the first gate electrode, can be driven by the charge that is effective on the first gate electrode. Another part of the channel region, which is disposed beneath the second gate electrode, can be driven by the charge that is effective on the second gate electrode. A current can flow between the source/drain regions only when both the part of the channel region below the first gate electrode and the part of the channel region below the second gate electrode are conducting.

The diode structure is connected in a polarity such that when a voltage is present at the second gate electrode that controls the conductivity of the channel region beneath the second gate electrode, the diode structure turns off and the first gate electrode is thereby isolated from the voltage. The configuration ensures that the voltage for driving the second gate electrode is dropped only across the second gate electrode. The first gate electrode is isolated from the voltage by the diode structure, so that no voltage is dropped across the ferroelectric layer in such a case. The configuration prevents alteration of the polarization of the ferroelectric layer and, hence, of the stored information during the reading operation, during which the second gate electrode is driven.

By contrast, for writing and erasing information, a voltage that is suitable for polarizing the ferroelectric layer can be applied to the second gate electrode. In such a case, the information is written by a voltage that is greater than the reverse voltage of the diode structure and that polarizes the ferroelectric layer in one direction. The information is erased by a voltage with a different sign, so that the diode structure is forward-biased and the voltage dropped across the ferroelectric layer polarizes the latter in the other direction.

In the memory cell configuration, the ferroelectric transistor is sufficient per memory cell to store information in a nonvolatile manner and to read out the information nondestructively. An additional selection transistor is not necessary. Therefore, the memory cell configuration can be realized with a reduced space requirement.

In accordance with another feature of the invention, adjacent ferroelectric transistors along a word line are preferably connected up in series in the memory cell configuration. In such a case, the ferroelectric transistor of one of the memory cells is connected respectively between adjacent bit lines between which a current flow through the ferroelectric transistor is evaluated during the reading operation.

With regard to a reduced area requirement, in accordance with a further feature of the invention, it is advantageous in the configuration for the interconnected source/drain regions of adjacent ferroelectric transistors along a word line to be formed as a common diffusion region. In such a case, the width of the strip-type doped well regions, parallel to the course of the word lines, is in each case less than the distance between the centers of the source/drain regions of the respective ferroelectric transistor. The configuration ensures that the strip-type doped well regions of adjacent ferroelectric transistors along a word line are insulated from one another by the doping of the semiconductor substrate and the associated ferroelectric transistors can, thus, be driven unambiguously through the respective strip-type doped well regions.

With regard to reliable insulation between adjacent strip-type doped well regions, in accordance with an added feature of the invention, it is advantageous to provide the width of the strip-type doped well regions to be so large that the two source/drain regions of the respective ferroelectric transistor are disposed within the respective strip-type doped well region. In such a case, it is advantageous for adjacent strip-type doped well regions to be isolated from one another by a dielectric isolation structure that avoids the occurrence of latch-up effects between adjacent strip-type doped well regions.

In accordance with an additional feature of the invention, the second gate intermediate layer and the second gate electrode are preferably each composed of two partial structures that are disposed mirror-symmetrically with respect to the first gate intermediate layer. The two partial structures of the second gate electrode are electrically connected to one another. Such a configuration has the advantage that the voltage present at the second gate electrode brings about, during the reading mode, an electric field such that the ferroelectric layer lies on an equipotential line and, consequently, no alteration whatsoever of the polarization of the ferroelectric layer occurs. This configuration of the invention is particularly insensitive to interference.

In accordance with yet another feature of the invention, it is advantageous to provide a dielectric layer between the surface of the semiconductor substrate and the ferroelectric layer, which dielectric layer facilitates the application of the ferroelectric layer.

In accordance with yet a further feature of the invention, with regard to the fabrication of the ferroelectric transistor, it is advantageous for the dielectric layer that is disposed in the first gate intermediate layer between the semiconductor surface and the ferroelectric layer and the dielectric layer that is part of the second gate intermediate layer to be formed as continuous dielectric layer at whose surface the stack including the ferroelectric layer and the first gate electrode is produced.

Preferably, in accordance with yet an added feature of the invention, the first gate electrode and/or the second gate electrode are/is part of the diode structure. As such, the space requirement of the diode structure decreases.

In accordance with yet an additional feature of the invention, the first gate electrode preferably has polycrystalline silicon doped by a first conductivity type. The second gate electrode likewise has polycrystalline silicon doped by a second conductivity type, which is opposite to the first conductivity type. In such a case, the first gate electrode adjoins the second gate electrode, so that the diode structure is formed by the first gate electrode and the second gate electrode. In the configuration, only four terminals are required for operating the ferroelectric transistor, two on the source/drain regions, one on the second gate electrode, and one for the strip-type doped well region. As an alternative, in the configuration, the first gate electrode and the second gate electrode respectively may be formed from correspondingly doped silicon grown epitaxially.

For technological reasons, in accordance with again another feature of the invention, it may be advantageous to provide between the ferroelectric layer and the first gate electrode an auxiliary layer made, for example, of platinum or of dielectric material, for example, made of $CeO_2$, $ZrO_2$, or the like with a thickness of approximately 2 to 10 nm, which avoids undesirable properties of the ferroelectric layer such as, for example, fatigue or imprint resistance. If the auxiliary layer is formed from conductive material, then it is insulated from the second gate electrode.

It lies within the scope of the invention to use a semiconductor substrate that has monocrystalline silicon at least in the region of the active regions of the ferroelectric transistors. In particular, a monocrystalline silicon wafer or the monocrystalline silicon layer of an SOI substrate is suitable as the semiconductor substrate. Furthermore, all semiconductor substrates that are appropriate for the fabrication of integrated circuits are suitable.

In accordance with a concomitant feature of the invention, the first gate intermediate layer contains at least one of the group consisting of $CeO_2$, $ZrO_2$, $Y_2O_3$, and $SrTiO_3$, the second gate intermediate layer contains at least one of the group consisting of $SiO_2$, $CeO_2$, $ZrO_2$, and $SrTiO_3$, the ferroelectric layer contains at least one of the group consisting of strontium bismuth tantalate, lead zirconium titanate, lithium niobate, and barium strontium titanate, and the semiconductor substrate contains monocrystalline silicon.

It also lies within the scope of the invention for the first gate intermediate layer to contain a dielectric layer made of $CeO_2$, $ZrO_2$, $Y_2O_3$, or another oxide having the largest possible dielectric susceptibility, such as, for example, $SrTiO_3$. In particular, $SiO_2$, $CeO_2$, $ZrO_2$, $Y_2O_3$, or another oxide with the largest possible dielectric susceptibility, such as, for example, $SrTiO_3$, is suitable for the dielectric layer in the second gate intermediate layer. The ferroelectric layer may be made, inter alia, of strontium bismuth tantalate (SBT), lead zirconium titanate (PZT), lithium niobate ($LiNbO_3$), or barium strontium titanate (BST).

Other features that are considered as characteristic for the invention are set forth in the appended claims.

Although the invention is illustrated and described herein as embodied in a memory cell configuration, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
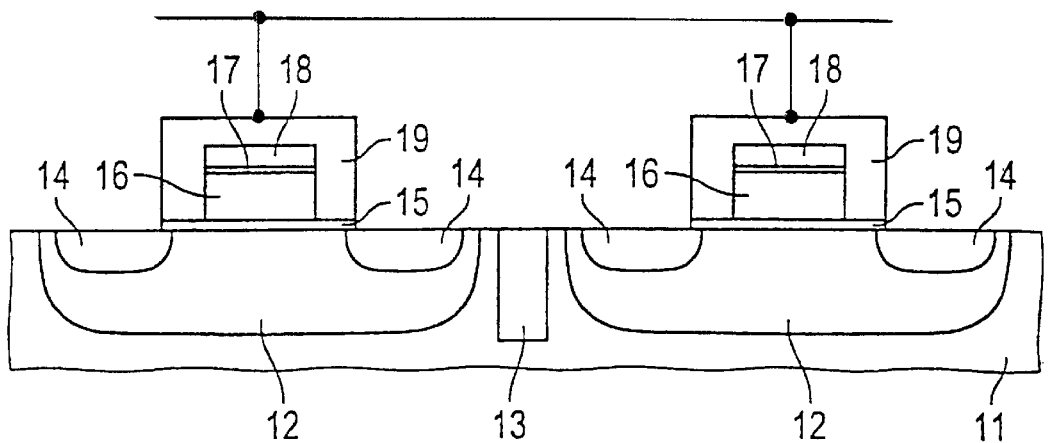
FIG. 1 is a cross-sectional view through a memory cell configuration having ferroelectric transistors as memory cells according to the invention, the transistors disposed in a strip-type doped well region.

Referring now to the figures of the drawings in detail and first, particularly to FIG. 1 thereof, there is shown strip-type doped well regions 12 disposed in a semiconductor substrate 11 made of phosphorus-doped, monocrystalline silicon. The well regions 12 are p-doped with a dopant concentration of a few $10^{16}$ cm$^{-3}$ and an edge doping of approximately $5 \cdot 10^{17}$ cm$^{-3}$ (see FIG. 1). Parallel to the surface of the semiconductor substrate 11, the strip-type doped well regions 12 have a cross-section corresponding to the respective technology generation. Adjacent strip-type doped well regions 12 are insulated from one another by a dielectric isolation structure 13. The dielectric isolation structure 13 is realized as a trench filled with insulating material in the sense of a so-called shallow trench isolation.

Ferroelectric transistors are disposed in each of the strip-type doped well regions 12. These transistors each have two source/drain regions 14 that are disposed beside one another in the direction of the smaller dimension of the strip-type doped well region 12. The region between the two source/drain regions 14 acts as a channel region. The source/drain regions 14 are n$^+$-doped.

Disposed at the surface of the channel region is a dielectric layer 15 that has a layer thickness of 5 to 10 nm and is formed from $CeO_2$ or $ZrO_2$.

Disposed at the surface of the dielectric layer 15 is a ferroelectric layer 16, whose cross-section parallel to the surface of the substrate 11 is smaller than that of the dielectric layer 15. The dielectric layer 15 projects beyond the ferroelectric layer 16 laterally. An auxiliary layer 17 is disposed at the surface of the ferroelectric layer 16 and a first gate electrode 18 is disposed at the surface of the auxiliary layer 17. Furthermore, a second gate electrode 19 is provided that meets the surface of the dielectric layer 15 on both sides of the ferroelectric layer 16 and covers the first gate electrode 18.

The ferroelectric layer 16 has a thickness of 50 to 100 nm and contains strontium bismuth tantalate (SBT) or lead zirconium titanate (PZT). The first gate electrode 18 is formed from p$^+$-doped polysilicon with a dopant concentration of a few $10^{16}$ to $10^{17}$ cm$^{-3}$. The auxiliary layer 17 is formed from $CeO_2$ or $ZrO_2$ with a thickness of 2 to 10 nm. The second gate electrode 19 is formed from n$^+$-doped polysilicon with a dopant concentration of a few $10^{16}$ to $10^{17}$ cm$^{-3}$. The first gate electrode 18 and the second gate electrode 19 together form a diode structure.

In an alternative embodiment, ferroelectric transistors are disposed in rows and columns in a semiconductor substrate 21, adjacent ferroelectric transistors along a row being connected up in series. The ferroelectric transistors each have two source/drain regions 22, between which a dielectric layer 23 is disposed at the surface of the semiconductor substrate 21. See FIG. 2. The semiconductor substrate 21 is an SOI substrate having a monocrystalline silicon wafer 210 on which are disposed a buried $SiO_2$ layer 211 and a monocrystalline silicon layer 212. The source/drain regions 22 are n-doped with a dopant concentration of a few $10^{20}$ cm$^{-3}$. The source/drain regions 22 reach as far as the buried $SiO_2$ layer 211. The dielectric layer 23 has a layer thickness of 5 to 10 nm and is formed from $CeO_2$ or $ZrO_2$.

Disposed at the surface of the dielectric layer 23 is a ferroelectric layer 24 made of strontium bismuth tantalate (SBT) or lead zirconium titanate (PZT) with a layer thickness of 50 to 100 nm. The cross-section of the ferroelectric layer 24 parallel to the surface of the substrate 21 is smaller than that of the dielectric layer 23, so that the dielectric layer 23 projects beyond the ferroelectric layer 24 laterally.

An auxiliary layer 25 made of $CeO_2$ or $ZrO_2$ with a thickness of 2 to 10 nm is disposed at the surface of the ferroelectric layer 24 and a first gate electrode 26 made of $p^+$-doped polysilicon with a dopant concentration of a few $10^{16}$ to $10^{17}$ cm$^{-3}$ is disposed at the surface of the auxiliary layer 25. The first gate electrode 26 has a thickness of 50 to 100 nm. A second gate electrode 27 made of $n^+$-doped polysilicon with a dopant concentration of a few $10^{16}$ to $10^{17}$ cm$^{-3}$ is disposed above the dielectric layer 23. The second gate electrode 27 covers the first gate electrode 26, so that it has a u-shaped cross-section in the section illustrated in FIG. 2. As a result, the two parts of the second gate electrode 27 that are disposed at the surface of the dielectric layer 23 are connected to one another. The first gate electrode 26 and the second gate electrode 27 together form a diode structure.

A strip-type doped well region 28 is in each case disposed between the source/drain regions 22 in the monocrystalline silicon layer 212. The well region 28 is p-doped with a dopant concentration of a few $10^{16}$ cm$^{-3}$ with a channel implantation of approximately $5 \cdot 10^{17}$ cm$^{-3}$. The width of the strip-type doped well regions 28 is measured such that adjacent strip-type doped well regions 28 that each adjoin a source/drain region 22 formed as a common diffusion region are insulated from one another and relative to one another by the buried $SiO^2$ layer 211.

If the auxiliary layer 17 or 25 is formed from a metal, for example, platinum, then the layer is insulated from the second gate electrode 19 or 27, respectively, for example, by $SiO_2$ spacers.

The auxiliary layer 17 or 25 can also be configured such that it covers the ferroelectric layer 16 or 24, respectively, at the top and laterally.

Figure 2:
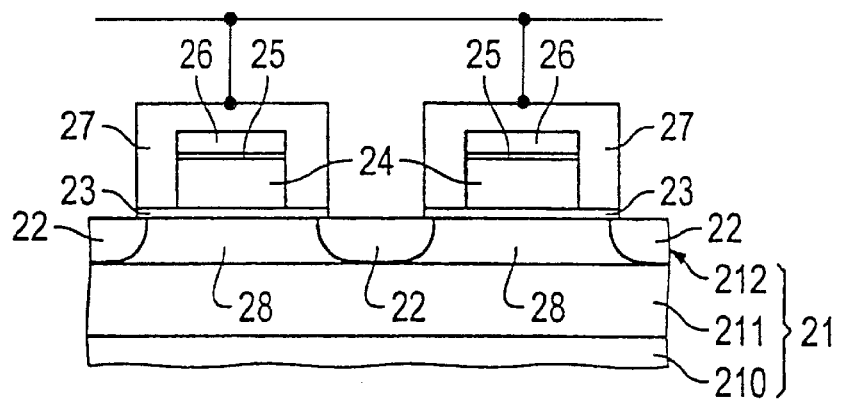
FIG. 2 is a cross-sectional view through a memory cell configuration having ferroelectric transistors as memory cells according to the invention, with adjacent ones of the ferroelectric transistors connected in series having a common source/drain region.
Figure 3:
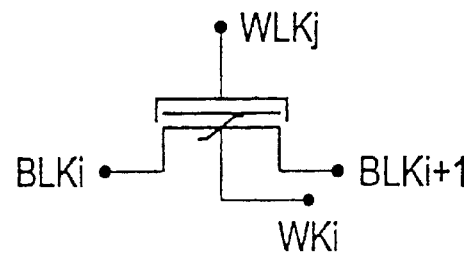
FIG. 3 us a schematic circuit diagram of a ferroelectric transistor according to the invention having a first gate electrode and a second gate electrode between which a diode structure is effective.

FIG. 3 illustrates a circuit symbol that is used hereinafter for a ferroelectric transistor, as has been explained with reference to FIGS. 1 and 2. The ferroelectric transistor has two bit line contacts BLKi, BLKi+1 that are connected to the two source/drain regions 14 or 22. Furthermore, the ferroelectric transistor has a word line contact WLKi that is connected to the second gate electrode 19 or 27. Furthermore, the ferroelectric transistor has a well contact WKi that is connected to the strip-type doped well region 28 or 12 or is formed by the strip-type doped well region 28 or 12.

Figure 4:
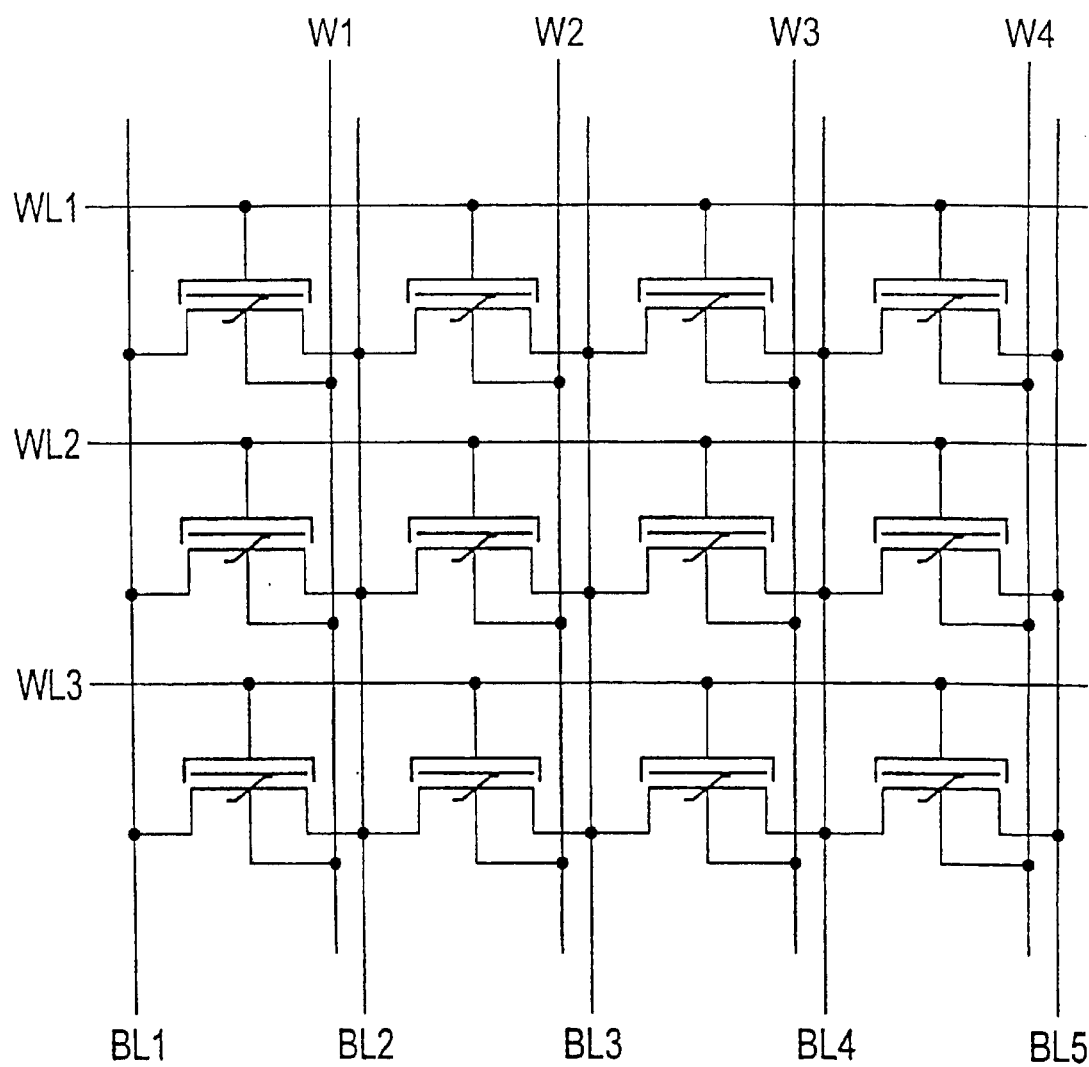
FIG. 4 is a schematic circuit diagram for a memory cell configuration according to the invention.

In the memory cell configuration, the word line contacts WLKj are connected to the associated word lines WLj (see FIG. 4, in which the reference symbols of the contacts of the ferroelectric transistor have not been entered, for the sake of clarity). Each of the ferroelectric transistors is connected between adjacent bit lines BLi, BLi+1 through its bit line contacts BLKi, BLKi+1. The bit lines BLi cross the word lines WLj. Furthermore, the well contacts WKi of the ferroelectric transistors are connected to the strip-type doped well regions Wi. The strip-type doped well regions Wi run parallel to the bit lines BLi and cross the word lines WLj.

A memory cell is selected through the word lines WLj and the strip-type doped well regions Wi crossing the latter. If it is intended that a memory cell be read, then the bit lines BLi, BLi+1 between which the corresponding memory cell is connected must additionally be selected.

A memory cell is read by a continuity test between the corresponding bit lines BLi, BLi+1. To that end, the second gate electrode is brought to inversion by a positive voltage that is greater than the threshold voltage. All the other memory cells along the bit line are not selected and, therefore, block in the region below the second gate electrode. A current between the bit lines BLi, BLi+1 between which the selected memory cell is connected can, therefore, flow only if the ferroelectric layer of the associated ferroelectric transistor is polarized such that the region below the first gate electrode conducts. Zero (0) volts (quiescent potential) are applied to the strip-type doped well region Wi of the selected cell and to all the remaining cells.

The selection of a memory cell for writing is effected through the associated word line WLj and the associated strip-type doped well region Wi. The word line WLj is put at a positive voltage, for example, 1.5 volts, and the strip-type doped well region Wi is put at a negative voltage, for example, −1.5 volts. The pn junction—disposed above the ferroelectric layer—between the first gate electrode and the second gate electrode, the ferroelectric layer, and the dielectric layer disposed beneath the ferroelectric layer represent a series circuit of capacitances, provided that the pn junction between the first gate electrode and the second gate electrode is operated in the reverse direction below the breakdown voltage.

For writing to the memory cells, the voltage that corresponds to the difference between the voltage values on the word line WLj and the strip-type doped well region Wi and is present across the series circuit of capacitances is chosen such that the pn junction between the first gate electrode and the second gate electrode breaks down. In such an example, the breakdown voltage is set to 2.1 to 2.3 V, for example, through the configuration of the interface between p-type and n-type region. Thus, the applied voltage is dropped across the ferroelectric layer, the dielectric layer disposed underneath, and the substrate. Accordingly, the voltage across the ferroelectric layer is about 1 volt; such voltage suffices to polarize the ferroelectric layer in one direction. The selected memory cell is thereby written to.

Zero (0) volts (quiescent potential) are applied to the strip-type doped well regions of cells that are adjacent along a word line. Memory cells that are adjacent along the strip-type doped well regions have zero (0) volts (quiescent potential) applied to them on the word line. Therefore, only a voltage that corresponds to the difference between the quiescent potential and 1.5 volts or the quiescent potential and −1.5 volts is dropped across these cells. Such a voltage is so low that the pn junction between the first gate electrode and the second gate electrode in these cells still blocks. Because the pn junction represents only a small capacitance, for instance smaller by a factor of 50 to 100, in comparison with the ferroelectric layer, the dielectric layer, and the semiconductor substrate, it is, thus, ensured that the voltage dropped across the pn junction, the ferroelectric layer, the dielectric layer, and the semiconductor substrate is primarily dropped across the pn junction. If the voltage is 1.5 volts in total, then the largest part of the voltage, 1.475 volts, is dropped across the pn junction formed from the first gate electrode and the second gate electrode. By contrast, only a very small portion of about 25 mV is dropped across the ferroelectric layer and the dielectric layer. Experiments have shown that, for a ferroelectric layer made of strontium bismuth tantalate (SBT) with a thickness of 180 nm, $10^{10}$ square wave voltage pulses with a voltage of 50 mV do not suffice to alter the polarization state of the ferroelectric layer. Therefore, in such a mode of operation and in the proposed memory cell configuration, it is ensured that at least $10^{10}$ write cycles of a cell are possible without the information of the adjacent memory cells being influenced.

Memory cells that are connected to different word lines WLk and different strip-type doped well regions Wl than the selected memory cell have quiescent potential applied to them both on the word line WLk and on the strip-type doped well region Wl and, therefore, are not influenced during the writing operation.

To erase a memory cell, the memory cell is again selected through the word line WLj and the strip-type doped well region Wi. The word line WLj is put at a negative voltage, for example, −1.5 volts, and the strip-type doped well region Wi is connected to quiescent potential 0 volts. The pn junction that is situated above the ferroelectric layer and is formed from the first gate electrode and the second gate electrode is, thus, forward-biased, so that the applied voltage is distributed between the ferroelectric layer and the dielectric layer. The layer thicknesses are coordinated with one another such that the voltage is distributed uniformly between the two layers. As a result, the ferroelectric layer is polarized in the opposite direction to that during the writing operation.

During the erasure of a memory cell, adjacent memory cells connected to the same strip-type region are connected to quiescent potential 0 volts through the word line, so that no voltage is dropped across them. Adjacent memory cells that are connected to the same word line WLj are connected to the negative voltage of −1.5 volts through the associated strip-type doped well region Wi so that, likewise, no voltage is dropped across these cells because the difference between the voltage on the word line WLj and the voltage across the strip-type doped well region Wi is 0.

In such a case, adjacent memory cells that are connected to different word lines WLk and different doped strip-type well regions Wl have applied to them only a voltage that is less than the breakdown voltage of the pn junction formed from the first gate electrode and the second gate electrode. Thus, the pn junction is reverse-biased and the largest part of the voltage is dropped across the pn junction. As assessed from the example of writing to a memory cell, the voltage that is dropped across the ferroelectric layer in such a case is so low that at least $10^{10}$ erase cycles of a cell are possible without the information of the adjacent memory cells being influenced.

We claim:

1. A memory cell configuration, comprising:
    a semiconductor substrate having:
        a surface;
        strip-type doped well regions; and
        integrated memory cells, each of said memory cells having a ferroelectric transistor;
    a diode structure;
    said ferroelectric transistor having:
        a first source/drain region;
        a second source/drain region;
        a first gate intermediate layer and a first gate electrode disposed at said surface of said substrate between said first and second source/drain regions;
        said first gate intermediate layer containing at least one ferroelectric layer;
        a second gate intermediate layer and a second gate electrode disposed between said first and second source/drain regions in a direction of a connecting line between said first and second source/drain regions;
        said second gate intermediate layer containing a dielectric layer; and
        beside said first gate intermediate layer, said second gate intermediate layer, said first gate electrode, and said second gate electrode connected to one another through said diode structure;
    word lines running substantially parallel to one another;
    said second gate electrode respectively connected to one of said word lines; and
    said strip-type doped well regions crossing said word lines and respectively running in a region between said first and second source/drain regions of said ferroelectric transistor.

2. The memory cell configuration according to claim 1, including bit lines, and wherein:
    adjacent ones of said ferroelectric transistors along one of said word lines are connected in series; and
    said ferroelectric transistor of one of said memory cells is respectively connected between adjacent ones of said bit lines.

3. The memory cell configuration according to claim 2, wherein:
    interconnected source/drain regions of adjacent ones of said ferroelectric transistors along one of said word lines are formed as a common diffusion region;
    said source/drain regions have centers;
    a width of said strip-type doped well regions parallel to a course of said word lines is respectively less than a distance between said centers of said source/drain regions of a respective one of said ferroelectric transistors.

4. The memory cell configuration according to claim 2, wherein a width of said strip-type doped well regions is dimensioned to dispose said first and second source/drain regions of a respective one of said ferroelectric transistors therewithin.

5. The memory cell configuration according to claim 4, including a dielectric isolation structure disposed between adjacent ones of said strip-type doped well regions.

6. The memory cell configuration according to claim 1, wherein:
    said second gate intermediate layer and said second gate electrode each are formed of two partial structures mirror-symmetrically disposed with respect to said first gate electrode; and
    said two partial structures of said second gate electrode are electrically connected to one another.

7. The memory cell configuration according to claim 1, wherein said first gate intermediate layer contains a dielectric layer disposed between said surface of said semiconductor substrate and said ferroelectric layer.

8. The memory cell configuration according to claim 7, wherein said dielectric layer of said first gate intermediate layer and said dielectric layer of said second gate intermediate layer are formed as a continuous dielectric layer.

9. The memory cell configuration according to claim 1, wherein at least one of the group consisting of said first gate electrode and said second gate electrode are part of said diode structure.

10. The memory cell configuration according to claim 9, wherein:
    said first gate electrode has polycrystalline silicon doped by a first conductivity type;
    said second gate electrode has polycrystalline silicon doped by a second conductivity type opposite to said first conductivity type; and
    said first gate electrode adjoins said second gate electrode.

11. The memory cell configuration according to claim 1, including an auxiliary layer disposed between said ferroelectric layer and said first gate electrode.

12. The memory cell configuration according to claim 1, wherein:
  said first gate intermediate layer contains one of the group consisting of $CeO_2$, $ZrO_2$, $Y_2O_3$, and $SrTiO_3$;
  said second gate intermediate layer contains one of the group consisting of $SiO_2$, $CeO_2$, $ZrO_2$, and $SrTiO_3$;
  said ferroelectric layer contains one of the group consisting of strontium bismuth tantalate, lead zirconium titanate, lithium niobate, and barium strontium titanate; and
  said semiconductor substrate contains monocrystalline silicon.

13. The memory cell configuration according to claim 10, wherein:
  said first gate intermediate layer contains at least one of the group consisting of $CeO_2$, $ZrO_2$, $Y_2O_3$, and $SrTiO_3$;
  said second gate intermediate layer contains at least one of the group consisting of $SiO_2$, $CeO_2$, $ZrO_2$, and $SrTiO_3$;
  said ferroelectric layer contains at least one of the group consisting of strontium bismuth tantalate, lead zirconium titanate, lithium niobate, and barium strontium titanate; and
  said semiconductor substrate contains monocrystalline silicon.

14. A memory cell configuration, comprising:
  a semiconductor substrate having:
    a surface;
    strip-type doped well regions; and
    integrated memory cells, each of said memory cells having a ferroelectric transistor;
  a diode structure;
  said ferroelectric transistor having:
    a first source/drain region;
    a second source/drain region;
    a first gate intermediate layer and a first gate electrode disposed at said surface of said substrate between said first and second source/drain regions;
    said first gate intermediate layer containing at least one ferroelectric layer;
    a second gate intermediate layer and a second gate electrode disposed between said first and second source/drain regions;
    said second gate intermediate layer containing a dielectric layer; and
    beside said first gate intermediate layer, said second gate intermediate layer, said first gate electrode, and said second gate electrode connected to one another through said diode structure;
  word lines running substantially parallel to one another;
  said second gate electrode respectively connected to one of said word lines; and
  said strip-type doped well regions crossing said word lines and respectively running in a region between said first and second source/drain regions of said ferroelectric transistor.

15. A memory cell configuration, comprising:
  a semiconductor substrate having:
    a surface;
    strip-type doped well regions; and
    integrated memory cells, each of said memory cells having a ferroelectric transistor;
  a diode structure;
  said ferroelectric transistor having:
    a first source/drain region;
    a second source/drain region;
    a first gate intermediate layer and a first gate electrode disposed at said surface of said substrate between said first and second source/drain regions;
    said first gate intermediate layer containing at least one ferroelectric layer;
    a second gate intermediate layer and a second gate electrode disposed between said first and second source/drain regions substantially along a line connecting said first and second source/drain regions;
    said second gate intermediate layer containing a dielectric layer; and
    beside said first gate intermediate layer, said second gate intermediate layer, said first gate electrode, and said second gate electrode connected to one another through said diode structure;
  word lines running substantially parallel to one another;
  said second gate electrode respectively connected to one of said word lines; and
  said strip-type doped well regions crossing said word lines and respectively running in a region between said first and second source/drain regions of said ferroelectric transistor.

\* \* \* \* \*